(12) United States Patent
Koshizawa et al.

(10) Patent No.: US 10,998,329 B2
(45) Date of Patent: May 4, 2021

(54) METHODS AND APPARATUS FOR THREE DIMENSIONAL NAND STRUCTURE FABRICATION

(71) Applicant: APPLIED MATERIALS, INC., Santa Clara, CA (US)

(72) Inventors: Takehito Koshizawa, San Jose, CA (US); Mukund Srinivasan, Santa Clara, CA (US); Tomohiko Kitajima, San Jose, CA (US); Chang Seok Kang, San Jose, CA (US); Sung-Kwan Kang, San Jose, CA (US); Gill Y. Lee, San Jose, CA (US); Susmit Singha Roy, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/517,956

(22) Filed: Jul. 22, 2019

(65) Prior Publication Data

US 2020/0373310 A1 Nov. 26, 2020

Related U.S. Application Data

(60) Provisional application No. 62/851,699, filed on May 23, 2019.

(51) Int. Cl.
*H01L 27/1157* (2017.01)
*H01L 27/11582* (2017.01)

(52) U.S. Cl.
CPC .... *H01L 27/1157* (2013.01); *H01L 27/11582* (2013.01)

(58) Field of Classification Search
None
See application file for complete search history.

(56) References Cited

U.S. PATENT DOCUMENTS

| | | |
|---|---|---|
| 5,236,550 A | 8/1993 | Abt et al. |
| 8,858,499 B2 | 10/2014 | Masuda et al. |
| 9,230,983 B1 | 1/2016 | Sharangpani et al. |
| 9,653,311 B1 | 5/2017 | Ahn et al. |
| 10,115,459 B1 | 10/2018 | Yamada et al. |
| 2010/0155801 A1 | 6/2010 | Doyle et al. |
| 2010/0198687 A1 | 8/2010 | Bang et al. |
| 2014/0220750 A1 | 8/2014 | Sohn et al. |
| 2015/0357342 A1 | 12/2015 | Lee |
| 2016/0126251 A1 | 5/2016 | Fujita et al. |

(Continued)

OTHER PUBLICATIONS

International Search Report and Written Opinion for PCT/US2020/029063 dated Jul. 29, 2020.

*Primary Examiner* — Robert K Carpenter
(74) *Attorney, Agent, or Firm* — Moser Taboada (57) ABSTRACT

Methods and apparatus for forming a plurality of nonvolatile memory cells are provided herein. In some embodiments, the method, for example, includes forming a plurality of nonvolatile memory cells, comprising forming, on a substrate, a stack of alternating layers of metal including a first layer of metal and a second layer of metal different from the first layer of metal; removing the first layer of metal to form spaces between the alternating layers of the second layer of metal; and one of depositing a first layer of material to partially fill the spaces to leave air gaps therein or depositing a second layer of material to fill the spaces.

9 Claims, 7 Drawing Sheets

(56) References Cited

U.S. PATENT DOCUMENTS

2016/0172374 A1 6/2016 Jeon
2016/0233227 A1 8/2016 Zhang et al.
2019/0080915 A1* 3/2019 Roy .................... C23C 28/3455

* cited by examiner

METHODS AND APPARATUS FOR THREE DIMENSIONAL NAND STRUCTURE FABRICATION

CROSS-REFERENCE TO RELATED APPLICATION(S)

The present application claims priority to and the benefit of U.S. Provisional Patent Application Ser. No. 62/851,699, which was filed on May, 23, 2019, the entire contents of which is incorporated herein by reference.

FIELD

Embodiments of the present disclosure generally relate to substrate processing equipment and techniques, and more particularly, to methods and apparatus for three dimensional (3D) NAND structure fabrication.

BACKGROUND

To address challenges encountered in scaling planar (2D) NAND memory devices to achieve higher densities at a lower cost per bit, ultra-high density, three-dimensional (3D) stacked memory structures have been introduced. Such 3D memory structures are sometimes referred to as having a Bit Cost Scalable (BiCS) architecture, and include strings of vertically aligned memory cells. Typically, the vertically aligned memory cells are formed from an array of alternating conductor and insulator layers, where the conductive layers correspond to the word lines of the memory structure.

As the number of vertically stacked memory cells in 3D NAND devices increases (e.g., as chip densities increase), the aspect ratio of memory cell strings also increases, introducing numerous manufacturing issues. The inventors have observed for example, that as stacking increases, the difficulty in etching/filling and stress control also increases. The inventors have further observed that thinning down the layers in the stack to maintain the aspect ratio of the memory cell strings within manageable limits results in more challenging downstream etch processes.

Accordingly, the inventor has provided methods and apparatus for 3D NAND structure fabrication.

SUMMARY

Methods and apparatus for forming a plurality of nonvolatile memory cells are provided herein. In some embodiments, the method includes forming, on a substrate, a stack of alternating layers of metal including a first layer of metal and a second layer of metal different from the first layer of metal; removing the first layer of metal to form spaces between the alternating layers of the second layer of metal; and one of depositing a first layer of material to partially fill the spaces to leave air gaps therein or depositing a second layer of material to fill the spaces.

In accordance with some embodiments of the present disclosure, there is provided a semiconductor memory device that includes a substrate including a stack of alternating layers of material including a first layer of material that is at least one of metal, metal nitride, or conductive metal compound and a second layer of material that is at least one of metal, metal alloy, or metal with dopant including one or more metal elements, wherein the first layer of material is different from the second layer of material.

In accordance with an aspect of the present disclosure, there is provided a system for forming a plurality of nonvolatile memory cells. The system includes an apparatus configured to deposit on a substrate a layer of silicon nitride (SiN) and poly-silicon (poly-Si) and a stack of alternating layers of metal including a first layer of metal and a second layer of metal different from the first layer of metal; an apparatus configured to remove the first layer of metal to form spaces between the alternating layers of the second layer of metal; and an apparatus configured to one of deposit a first layer of material to partially fill the spaces to leave air gaps therein or deposit a second layer of material to fill the spaces.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments described herein generally relate to 3D NAND memory devices with improved word-line isolation and methods of forming the same. Specifically, alternative layers of material, e.g., a first layer of metal and a second layer of metal which are different types of metals) multilayers are used for 3D NAND cell film stack to form memory holes. One of the metal layers (e.g., the first metal can be subsequently removed (e.g., etched) forming spaces that are then filled with one or more materials, e.g., a low k oxide (e.g., SiO, $SiO_2$. etc.) or an air gap). Both metal layers can be etched out using the same etch chemistries. Thus, (high aspect ratio) HAR etch can be performed with higher throughput. For example, both metals can be etched away using dry chemical etching containing hydrofluoric acid (HF) with a high selectivity (e.g., >100:1). Moreover, embodiments described herein eliminate a wordline (WL) metal filling step, which is sometimes used with conventional methods for forming 3D NAND memory devices and which is a critical step for replacement metal gate (RMG), e.g., used with oxygen nitrogen (ON) mold. As described herein, WL metal can be deposited as mold stacks and silicon oxide can be filled after removing the TiN; $SiO_2$ filling is a much easier and cost effective process than conventional processes used for WL metal filling. Also, voids that can sometimes form due to incomplete filling of the $SiO_2$ is not harmful to the fabricated 3D NAND memory devices described herein, as the voids can function as air gaps (which can be formed without incorporating any extra-steps), as opposed to voids formed during conventional RMG processes, which can result in serious $SiO_2$ degradation due to remaining fluorine (F) gas that can be present in the voids. Furthermore, mechanical stress of mold stacks used in forming the 3D NAND memory device can be modulated by deposition conditions of metal using physical vapor deposition (PVD) or chemical vapor deposition (CVD), and overall stack height can be thinner, when compared to current $SiO_2$/silicon nitride ($Si_3N_4$) multi-layers, e.g., as a result of not having to use RMG.

Figure 1:
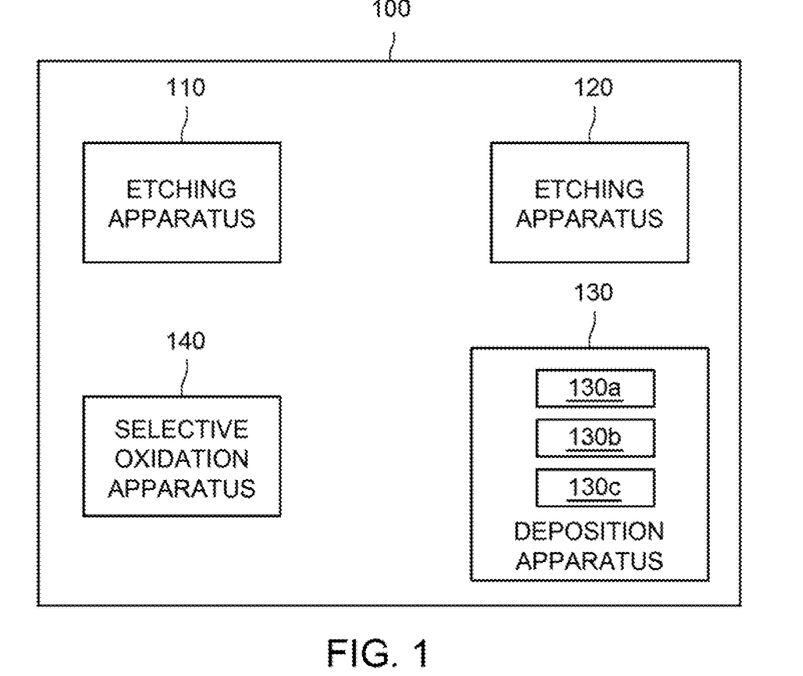
FIG. 1 is a schematic diagram of a system for forming a plurality of nonvolatile memory cells in a 3D NAND memory device, in accordance with at least one embodiment of the present disclosure.
Figure 2:
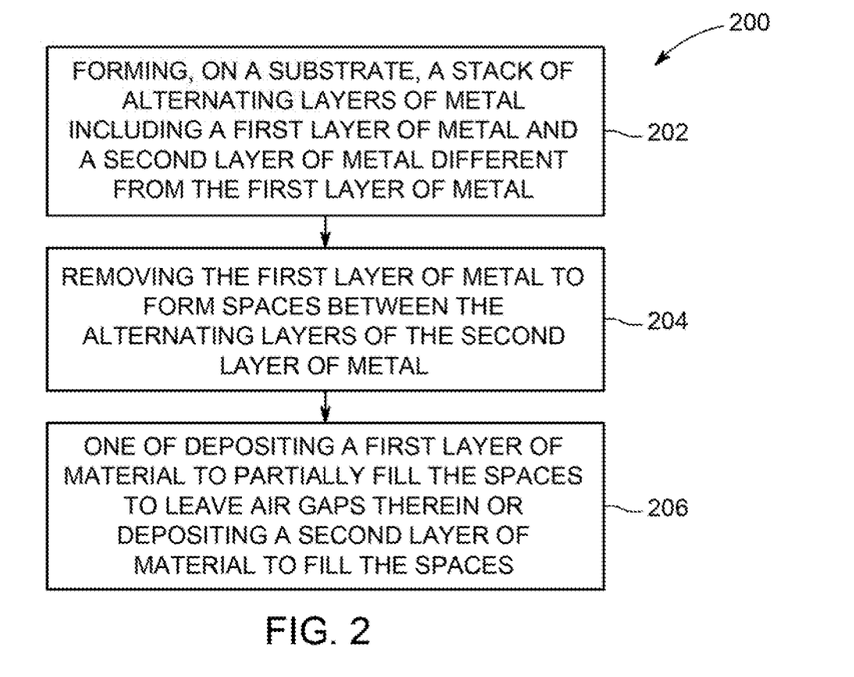
FIG. 2 is a flowchart of a method for forming a plurality of nonvolatile memory cells in a 3D NAND memory device, in accordance with at least one embodiment of the present disclosure.
Figure 3A:
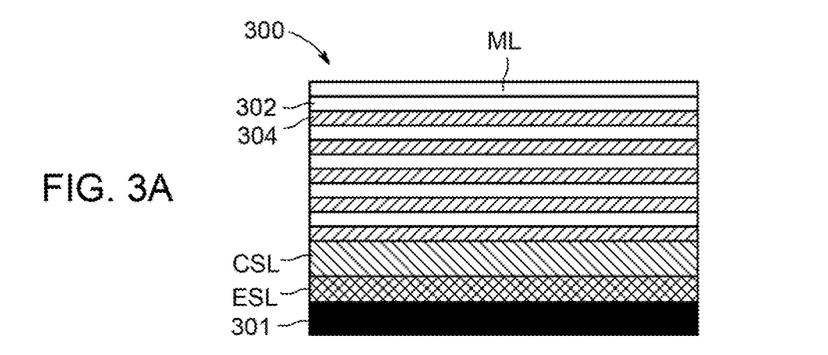
FIGS. 3A-3P are schematic cross-sectional views of a portion of a 3D NAND memory device, in accordance with at least one embodiment of the present disclosure.
Figure 3B:
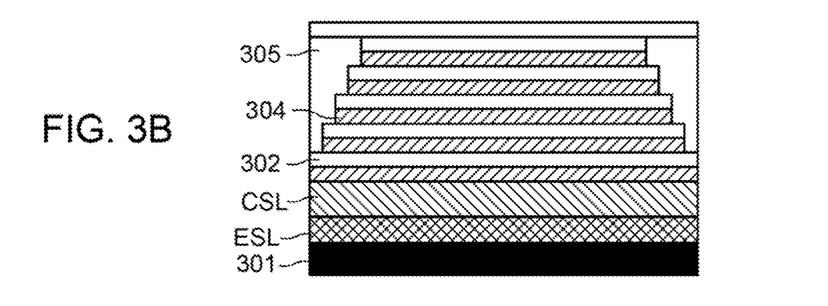
Figure 3C:
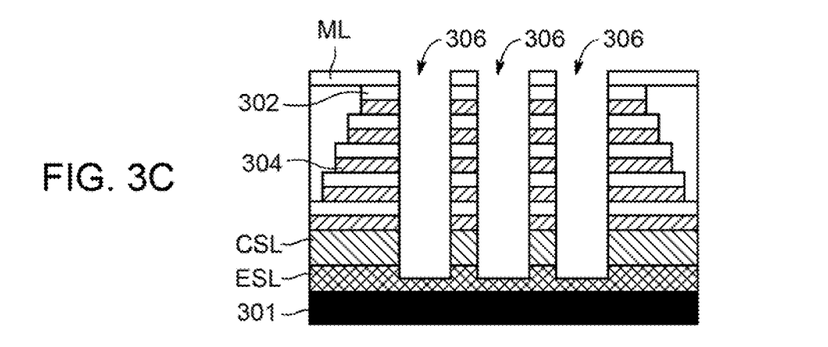
Figure 3D:
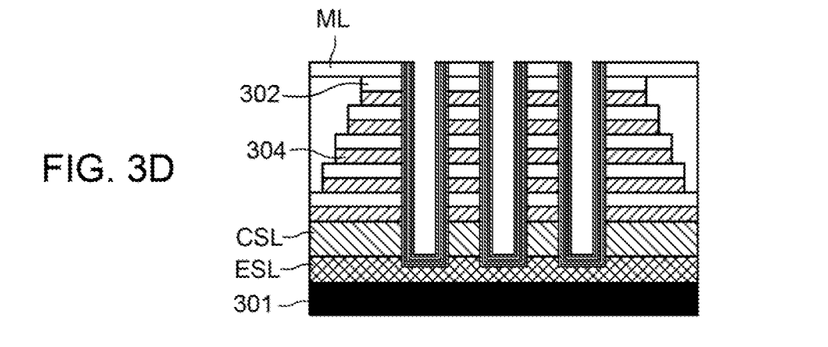
Figure 3E:
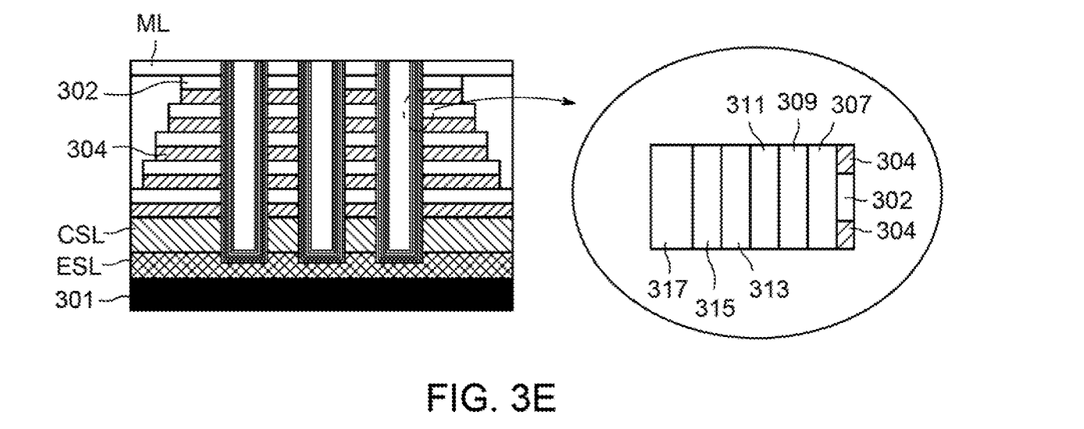
Figure 3F:
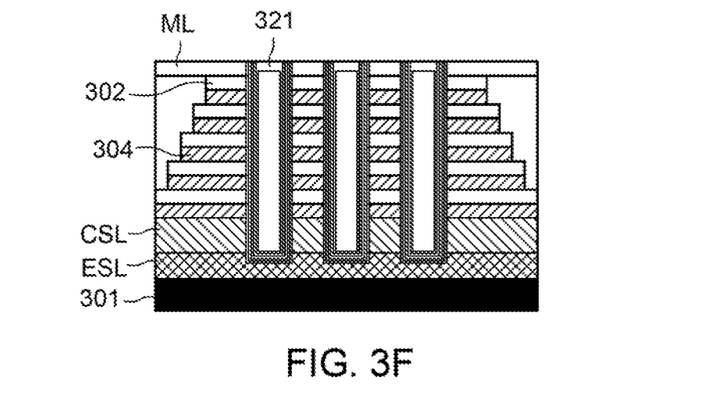
Figure 3G:
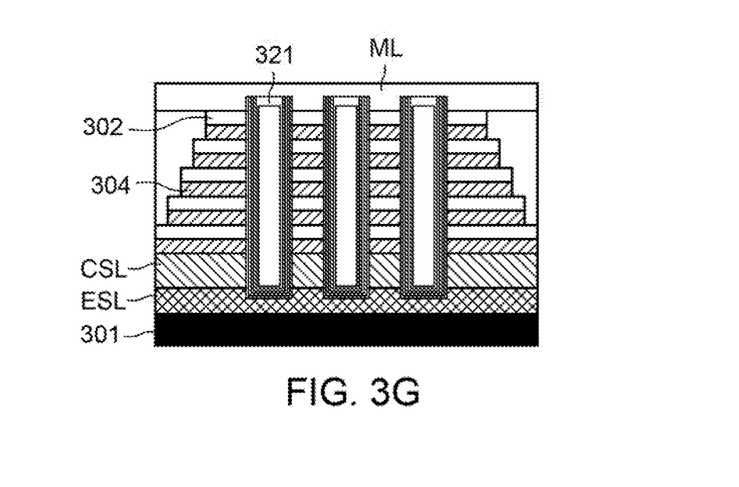
Figure 3H:
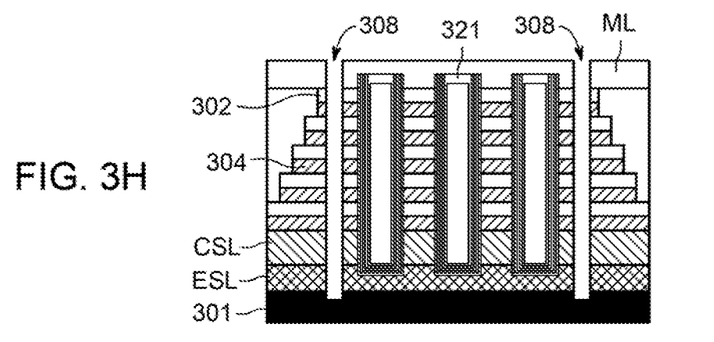
Figure 3I:
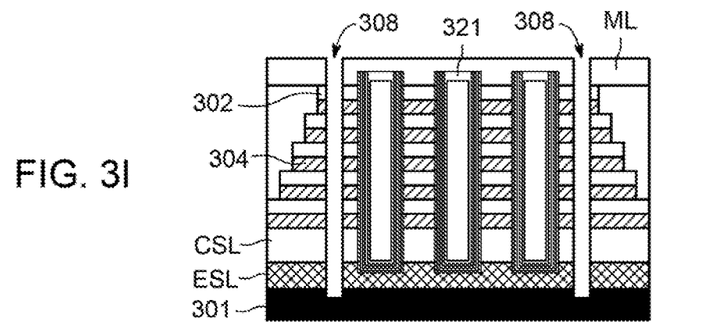
Figure 3J:
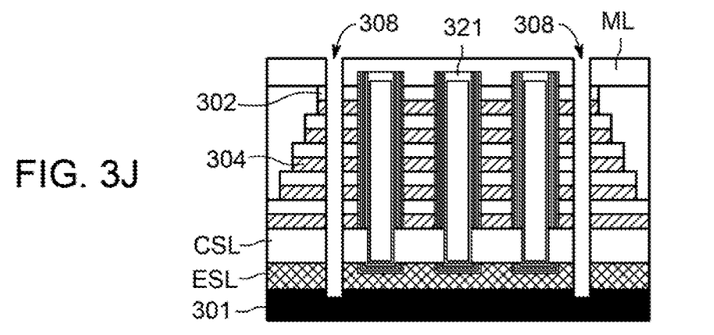
Figure 3K:
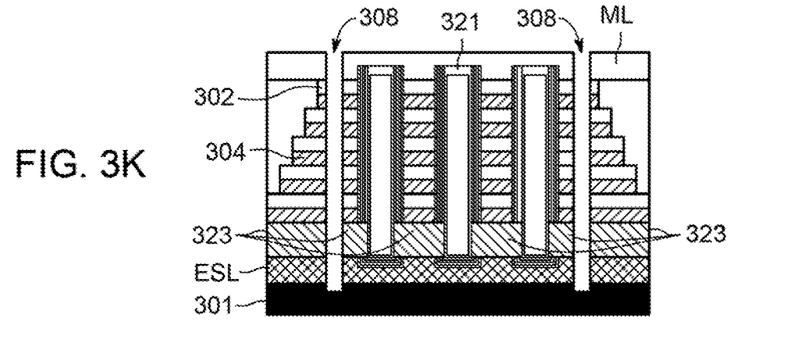
Figure 3L:
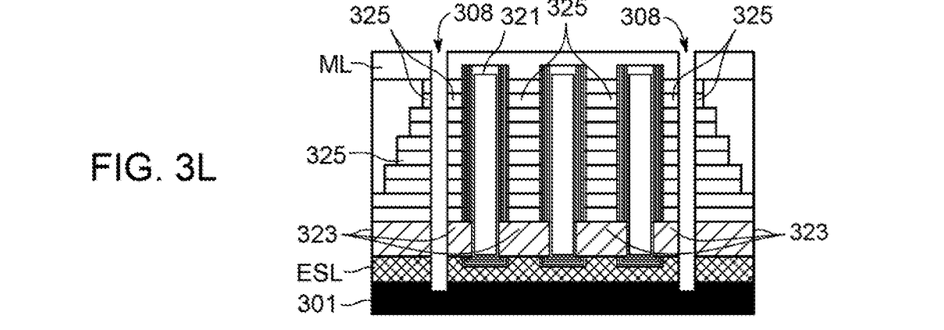
Figure 3M:
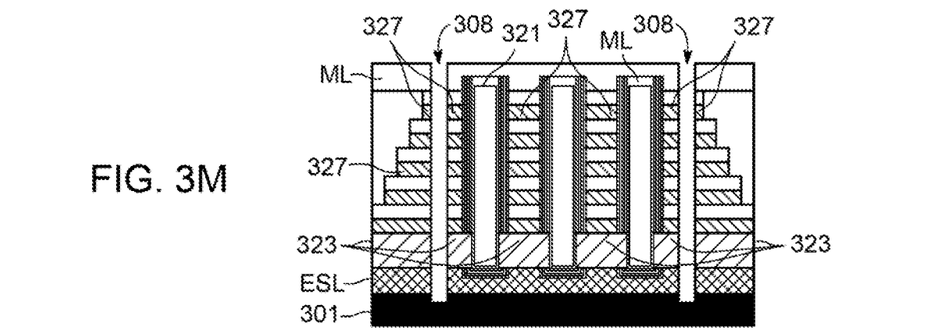
Figure 3N:
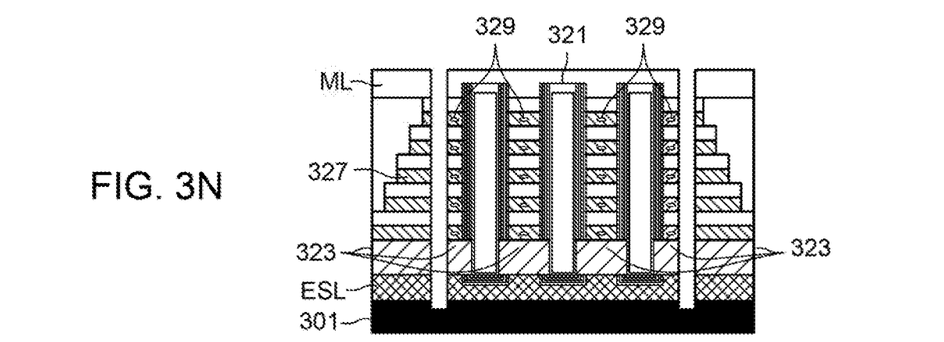
Figure 3O:
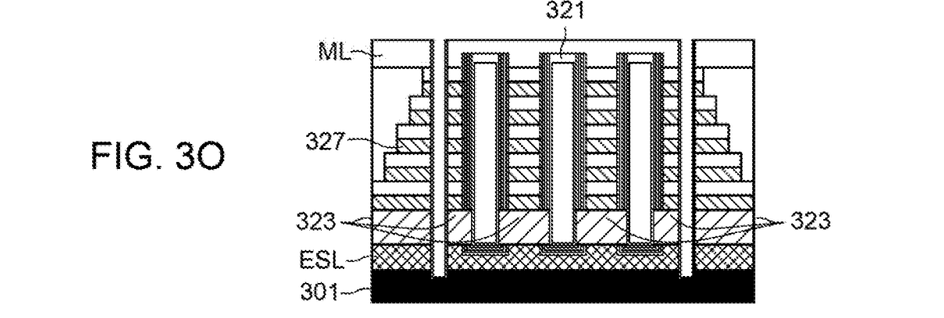
Figure 3P:
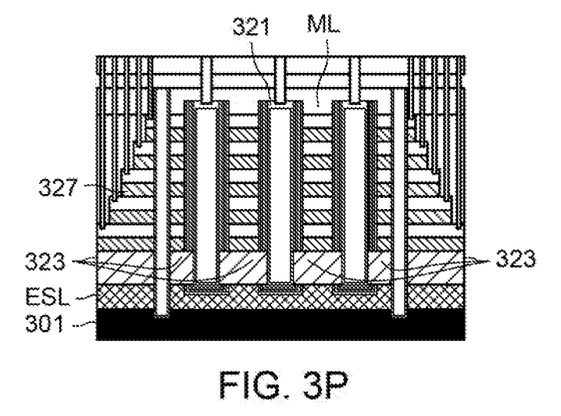

FIG. 1 is a schematic diagram of a system 100 for forming a plurality of nonvolatile memory cells in a 3D NAND memory device (e.g., memory device 300 of FIGS. 3A-3P). FIG. 2 is a flowchart of a method 200 for forming the plurality of nonvolatile memory cells in the memory device, according to an embodiment of the present disclosure. FIGS. 3A-3P are schematic cross-sectional views of a portion of a 3D NAND memory device during stages of fabrication in accordance with at least one embodiment of the present disclosure, for example, using the method 200.

FIG. 3A shows the memory device 300, which can be a Bit Cost Scalable (BiCS) device, including a string (plurality) of vertically stacked memory cell layers 302 (e.g., a conductive layer used as word line (e.g., a second layer of material) alternately disposed between a plurality of layers 304 (e.g., a first layer of material), formed on a substrate 301, which in some embodiments can be a semiconductor.

The substrate 301 can be any suitable starting material for forming integrated circuits, such as a silicon (Si) wafer or a germanium (Ge) wafer. The semiconductor substrate 301 may be a silicon semiconductor substrate having a layer or layers formed thereon, such as a film stack, employed to form a structure on substrate 301, such as the memory device 300. The substrate 301 may include a material such as crystalline silicon (e.g., Si<100> or Si<111>), Si3N4, strained silicon, silicon germanium, doped or undoped poly-silicon (poly-Si), doped or undoped silicon, patterned or non-patterned wafer, silicon on insulator (SOI), carbon-doped silicon oxides, silicon nitride (SiN, $Si_3N_4$, etc.), doped silicon, germanium, gallium arsenide, glass, sapphire, metal layers disposed on silicon, and the like. The substrate 301 may be a round wafer, such as a 200 mm, 300 mm, or 450 mm diameter wafer, or as a rectangular or square panel.

In some embodiments, the memory cell layers 302 and layers 304 can be formed on a common source line (CSL) layer, which can be formed on an etch stop layer (ESL). In such embodiments, the CSL layer and the ESL can be made from materials such as tungsten (W), silicon nitride (SiN), poly-Si, or combinations thereof. In some embodiments, a mask layer (ML) (e.g., a silicon oxide layer) can be deposited atop the memory cell layers 302 or the layers 304 to form a top or final layer of material. The ML is patterned before etching stacks to cover area which is not to be removed during stack etching process.

Layers 304 are disposed between memory cell layers 302. The layers 304 may be formed using any suitable material (e.g., metal, metal nitride, or a conductive metal compound) such as W, molybdenum (Mo), tantalum (Ta), niobium (Nb), osmium (Os), zirconium (Zr), iridium (Ir), rhenium (Re), titanium (Ti), Ti nitride (N), TaN, WN, MoN, ZrN, $WO_x$, $RuO_x$, $IrO_x$, etc. The layers 304 are provided to facilitate forming (or building) the memory cell layers 302 on the semiconductor substrate 301. After the memory cell layers 302 are formed, the layers 304 are removed using one or more suitable processes and filled with one or more suitable materials, as will be described in greater detail below.

Each of the memory cell layers 302 corresponds to a word line of the memory device 300, each word line extending into the page to form additional memory cells of the memory device 300 that are not visible. Thus, each of the memory cell layers 302 is configured to store one or more bits of data. As such, each of the memory cell layers 302 can be formed using any suitable material (e.g., metal, metal alloy, metal with dopant including one or more metal elements) such as W, tungsten silicide (WSi), tungsten poly-Si (W/poly-Si), tungsten alloy, Ta, Ti, Nb, Os, Zr, Ir, Re, copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, nitride compounds thereof, such as titanium nitride (TiN) and tantalum nitride (TaN), and combinations thereof, among others. For each substrate 301, the memory cell layers 302 and the layers 304 are be formed from different materials. For example, in at least some embodiments, the memory cell layers 302 can be formed from W while the layers 304 can be formed from TiN; other material combinations can also be used.

Continuing with reference to FIG. 3A, at 202, the memory cell layers 302 and layers 304 can be deposited on the semiconductor substrate 301 using any suitable deposition processes and/or apparatus 130 (FIG. 1), examples of which can include a chemical vapor deposition (CVD) apparatus 130a, a physical vapor deposition (PVD) apparatus 130b, or an atomic layer deposition (ALD) apparatus 130c. For example, in one particular embodiment, the layers 304 (e.g., TiN) can be deposited using, for example, the PVD apparatus 130b, which can be a stand-alone apparatus or a part of a cluster tool, that is configured, for example, to perform a PVD process. Exemplary apparatus that can be configured for performing the above process can include, for example, the ENDURA® VERSA® line of stand-alone PVD apparatus, available from Applied Materials, Inc. Similarly, the memory cell layers 302 (e.g., W) can be deposited using for example, the CVD apparatus 130a, which can be a stand-alone apparatus or a cluster tool, that is configured, for example, to perform a CVD process. Exemplary apparatus that can be configured for performing the above process can include, for example, the PRODUCER® APF line of stand-alone CVD apparatus, available from Applied Materials, Inc. Alternatively or additionally, the layers 304 can be deposited using, for example, the CVD apparatus 130a, and the memory cell layers 302 can be deposited using for example, the PVD apparatus 130b, Next, the WL staircase can be formed by etching the memory cell layers 302, the layers 304, and the ML (FIG. 3B). For example, any suitable etching apparatus 110 (FIG. 1) and/or method may be employed to form the WL staircase such as deep reactive-ion etching (DRIE), a highly aniso-tropic etch process employed to create high aspect-ratio holes and trenches in wafers or other substrates. Etching gases suitable for such etching processes can include fluo-ride ($SF_6$, $CF_4$, $CHF_4$, $CH_3F$, $C_2F_6$, $C_4F_8$, and $NF_3$), chloride (HCl, $Cl_2$, $BCl_3$), bromide ($Br_2$, HBr), or, an oxygen containing gas (e.g., $O_3$, $O_2$, $CO_2$, CO, $H_2O$, NO, $NO_2$, $N_2O$, CO, and the like) and optionally may include an inert gas, such as argon (Ar) or helium (He).

After the WL staircase has been formed, an interlayer dielectric deposition (ILD) process can be performed to deposit a layer of material 305 over the memory cell layers 302 and the layers 304. The ILD process can use dielectric materials to that are to be filled in an area where the staircase is formed. In at least some embodiments, a thick silicon oxide (around ~1.2 times thicker than the stack height of the memory cell layers 302 and layers 304) is deposited and planarized by chemical mechanical polishing (CMP)

Next, with reference to FIG. 3C, using the etching apparatus 110 at least one memory hole 306 (or memory holes 306, e.g., three memory holes 306) are formed in the ML, the stack of alternating memory cell layers 302 and layers 304, the CSL, and partially in the ESL. Alternatively or additionally, the memory holes 306 can be formed to extend into the substrate 301. The string of vertically stacked memory cell layers 302 and layers 304 are shown arranged with four vertical columns. The etching apparatus 110 can be configured to use sulfur hexafluoride (SF6) chemistries with ion acceleration voltage ranging from 0.5~10 kV. A hard mask deposition process may first be performed prior to performing the etching, and a hard mask layer that is deposited prior to etching can be removed after etching is complete and the memory hole 306 is formed. Other etching apparatus and/or processes can be used to form the memory holes 306.

With reference to FIGS. 3D and 3E, after the memory holes 306 are formed, one or more additional layers of material can be deposited in the memory holes 306. For example, as shown in the indicated area of detail of FIG. 3E, a layer (e.g., a continuous layer) of aluminum oxide (AlO) (layer 307) is first deposited on sides that define the memory holes 306 and along the ESL at the bottom of the memory holes 306. Next, a layer of silicon oxide (layer 309) is deposited atop the layer A and along the bottom of the memory holes 306. Next a layer of trap-silicon nitride (SiN) (layer 311) is deposited atop the layer 309 and along the bottom of the memory holes 306. Next, another layer of silicon oxide 313 is deposited atop the layer 311 and along the bottom of the memory holes 306. Next, a layer of poly-Si (layer 315) is deposited atop the layer of silicon oxide 313 and along the bottom of the memory holes 306 to form a poly-Si channel at the bottom of the memory hole 306. Next, a core silicon oxide (layer 317), e.g., SiO, SiOC, etc, is deposited to fill the poly-Si channel (see FIG. 3E, for example). The layers 307-317 can be deposited using any suitable deposition processes and/or apparatus. For example, the CVD apparatus 130a and the PVD apparatus 130b of FIG. 1 can be used to perform CVD and PVD, respectively, to deposit the layers 307-317. Alternatively or additionally the ALD apparatus 130c, which can be a stand-alone apparatus or a cluster tool, that can be used to perform an ALD process to deposit the layers 307-317. Exemplary apparatus that can be configured for performing the above process include, for example, the OLYMPIA® line of ALD apparatus, available from Applied Materials, Inc.

After the layer 317 is deposited to fill the poly-Si channel, an additional layer 321 (e.g., a layer of poly-Si) can be deposited atop the layer 317 to cover the layer 317 and an additional ML layer may be deposited atop the layer 321 to cover the layer 321, as shown in FIGS. 3F and 3G.

Next, with respect to FIG. 3H, two additional slits or holes 308 can be formed (e.g., using the above-described etching process) in the ML, the stack of alternating memory cell layers 302 and layers 304, the CSL, the ESL, and partially into the substrate 301. Unlike the memory holes 306, however, the holes 308 are used to remove the CSL and the layer 304. For example, after the holes 308 are formed, the CSL is removed using the above-described etching process (e.g., wet etch and/or chemical dry etch) and so are the layers 309-313 that were deposited in the memory holes 306 within the CSL (see FIGS. 3I and 3J, for example).

Next, the areas that included the CSL and the layers 307-313 are filled with a phosphorous doped poly-Si (n+ type silicon) layer (e.g., a layer 323) and the holes 308 are left intact, e.g., not filled or minimally filled with the layer 323 (FIG. 3K).

Next, at 204, the layers 304 are removed using the above above-described etching process (e.g., wet etch or chemical dry etch using the etching apparatus 110). More particularly, the layers 304 (e.g., layers of TiN) are removed by selectively oxidizing the layers 304 to form spaces 325 between alternating layers of the memory cell layers 302 (e.g., layers of W), as depicted in FIG. 3L.

Removal of the layers 304 may be achieved using any suitable etching or patterning processes to selectively remove the layers 304 of from the memory device 300 without undesirably damaging the memory cell layers 302.

For example, any isotropic etch process that is selective to at least the memory cell layers 302 may be employed to remove the layers 304 with high selectivity. For example, in some embodiments, the layers 304 can be removed with a reactive species that is formed via a remote plasma from a process gas comprising oxygen ($O_2$) and nitrogen trifluoride ($NF_3$), such as an etching apparatus 120 of FIG. 1. The isotropic etch process can be performed in any suitable isotropic etch apparatus. Highly selective, isotropic dry etching processes that may be used for the removal of the layers 304 are described in U.S. Pat. No. 9,165,786, entitled "Integrated oxide and nitride recess for better channel contact in 3D architectures" and filed Aug. 5, 2014. The dry etch process may be performed using a suitable dry etching apparatus. Exemplary apparatus that can be configured for performing the above process include, for example, the PRODUCER® SELECTRA® line of etching apparatus (FIG. 1), available from Applied Materials, Inc., of Santa Clara, Calif.

Alternatively or additionally, to remove the layers 304 a selective oxidation apparatus 140 can be used to deposit a silicon oxide layer (not shown) on the layers 304 using rapid thermal oxidation (RTO), radical oxidation, or remote plasma oxidation (RPO), for example, decoupled plasma oxidation (DPO). In some embodiments, where a low thermal budget and/or reduced diffusion of oxygen are desired, plasma oxidation or radical oxidation may be utilized. As used herein, a low thermal budget means a thermal budget less than a furnace process of tens of minutes at 850 degrees Celsius peak temperature. For example, when RPO is used at 204, one or more suitable plasma reactors, such as RPO reactors available from Applied Materials, Inc. can be used to provide the silicon oxide layer on the layers 304.

Alternatively, a high thermal budget processes (i.e., high oxygen diffusion) may also be utilized. For example, high thermal budget processes (e.g., wet, dry, or RTO) can provide conformal oxidation, faster oxidation rates, and thicker oxidation.

The type of selective oxidation apparatus 140 and/or etching apparatus 120 used to remove the layers 304 of carbon can depend on one or more factors including, but not limited to, time constraints, desired oxidation rates, etc.

Regardless of the selective oxidation apparatus 140 and/or etch apparatus 120 (or etch process using the etch apparatus 110) used, after removal of the layers 304 from the memory device 300, a suspended film stack with only the memory cell layers 302 remains on the substrate 301 for further processing, see FIG. 3L.

In some embodiments, at 206, with reference to FIG. 3M, a layer of material 327 (e.g., low k (dielectric constant) oxide material, silicon oxide, silicon dioxide, etc.) can be deposited to fill the spaces 325 (e.g., with no air gaps). The layer of material 327 can be deposited using, for example, the CVD apparatus 130a or the ALD apparatus 130c of FIG. 1. The low k oxide material can include, but is not limited to, silicon oxide, silicon dioxide, etc. The layer of material 327 can have a dielectric constant of 3.9 and smaller than 3.9.

Conversely, with reference to FIG. 3N, at 204 in some embodiments, the layer of material 327 can be deposited to partially fill the spaces 325 to leave air gaps 329 therein. The layer of material 327 can be deposited using, for example, the CVD apparatus 130a or the ALD apparatus 130c of FIG. 1. The spaces 325 can be partially filled such that the air gaps 329 can take up any specific volume of the spaces 325.

After one of the processes of 206 are completed, the memory device 300 will have the stack of alternating memory cell layers 302 and the layer of material 327 (e.g., low k oxide material) with the air gaps (FIG. 3N) or without the air gap 329 contained therein (FIG. 3M). Once formed, the 3D NAND memory device 300 can be further processed to deposit a gate silicon oxide, e.g., for gate formation.

For example, after the processes of 206 are completed, the holes 308 can be filled (e.g., planarization) with one or more suitable materials including, but not limited to, TiN, W, SiN, oxide, or combinations thereof (FIG. 3O). Similarly, after planarization has been performed, one or more back end of the line (BEOL) processes (e.g., WL stair contact formation) can be performed to complete fabrication of the 3D NAND memory device 300 (FIG. 3P).

Figure 4A:
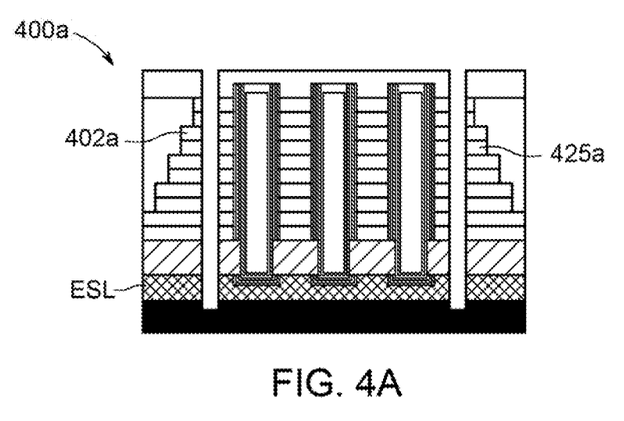
FIGS. 4A-4C are schematic cross-sectional views of a portion of a 3D NAND memory device, in accordance with at least one embodiment of the present disclosure.
Figure 4B:
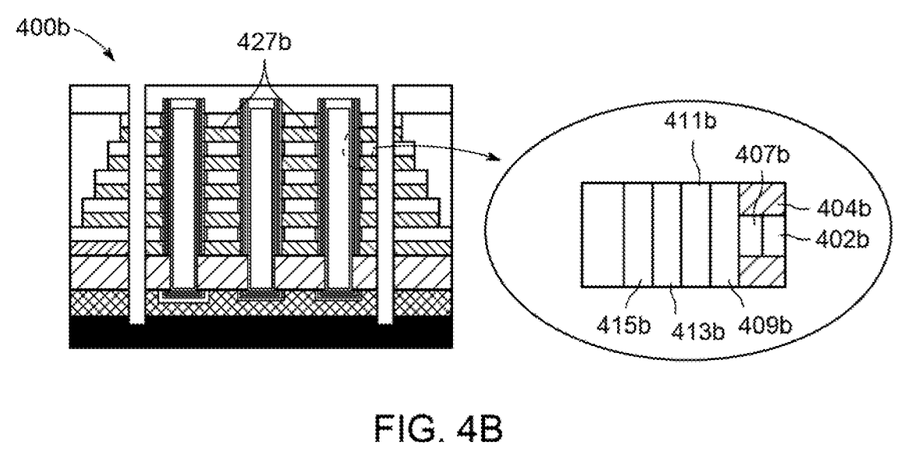
Figure 4C:
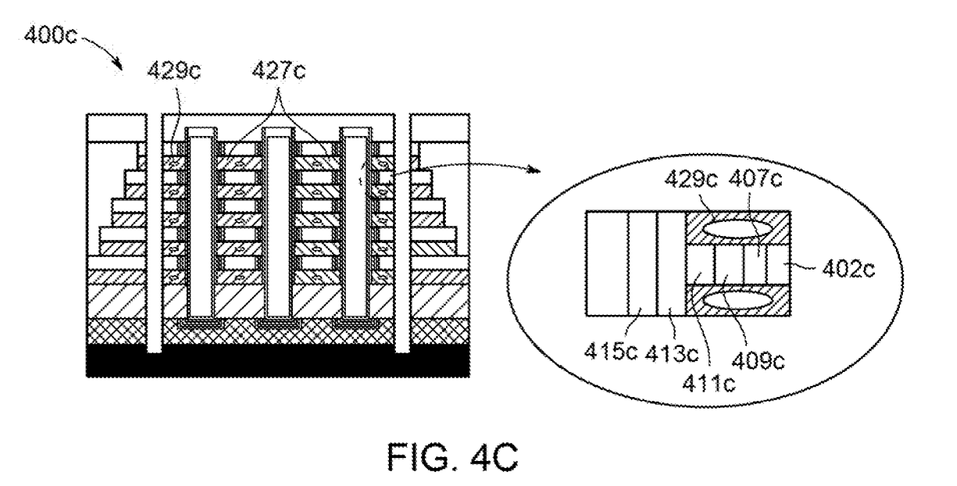

FIGS. 4A-4C are schematic cross-sectional views of a portion of 3D NAND memory devices 400a-400c, in accordance with at least one embodiment of the present disclosure. The 3D NAND memory devices 400a-400c are substantially similar to the 3D NAND memory device 300. Accordingly, only those features that are unique to the 3D NAND memory devices 400a-400c are herein described.

As illustrated in FIG. 4A, prior to 206 (e.g., depositing a layer of material (e.g., a layer of material 427b and 427c to fill spaces 425a (e.g., with or without air gaps 429c, as described above)), one or more layers of the layers that fill the memory holes (e.g., layers 407b-415b or layers 407c-415c) can be removed from the memory cell layers 402).

For example, as shown in the indicated area of detail in FIG. 4B, instead of applying a continuous layer 407b of the AlO, a discontinuous layer 407b may be formed to only cover the memory cell layers 402b (and not the layers 404b) on sides that define the memory holes and along the ESL at the bottom of the memory holes. The memory cell layers 402b having a discontinuous layer 407b can be made by removing the layer of 407b from the area in the memory hole adjacent to where the layer of material 427b is to be deposited prior to 206. By using the discontinuous layer 407b, cell-to-cell interference between the neighboring memory cell layers 402 can be reduced. For illustrative purposes, the 3D NAND memory device 400b is shown without air gaps.

Similarly, a discontinuous layer 407c and discontinuous layers of silicon oxide and SiN (e.g., layers 409c and 411c) can be used to form the 3D NAND memory device 400c (FIG. 4C). The memory cell layers 402c having discontinuous layers 407c-411c can be made by removing the layers 407c-411c from the area in the memory hole adjacent to where the layer of material 427c is to be deposited prior to 206. The memory cell layers 402c having discontinuous layers 407c-411c can prevent data loss through the layer 411c (e.g., trap SiN) between the neighboring memory cell layers 402c. For illustrative purposes, the 3D NAND memory device 400 is shown with air gaps 429c.

Figure 5:
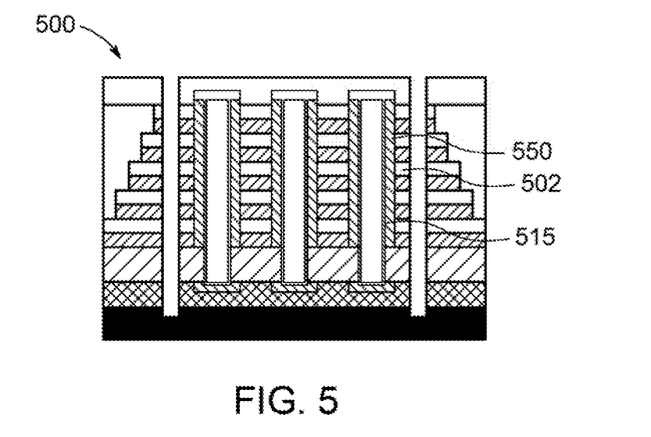
FIG. 5 is schematic cross-sectional views of a portion of a 3D NAND memory device, in accordance with at least one embodiment of the present disclosure.

FIG. 5 is schematic cross-sectional view of a portion of a 3D NAND memory device 500, in accordance with at least one embodiment of the present disclosure. The inventors have found that the present disclosure is not limited to charge trap based NAND flash memory devices. For example, a memory cell with a resistive RAM (ReRAM) or phase change memory (PCM) can be formed using the methods described herein. More particularly, as illustrated in FIG. 5, a resistive layer 550 of resistive memory material (e.g., $Ta_2O_5$, $TiO_2$, etc. for ReRAm or $Ge_xSb_yTe_z$ (GST), etc., for PCM) can be deposited between the memory cell layers 502 and the layer 515, which can be made from the same material as the layer 515 (e.g., for forming a poly-Si channel).

The methods described herein can be used to form the 3D NAND memory device, and cross-talk, e.g., leakage of trapped charges, among neighboring memory cells of the memory cell layers 302 of the memory device 300 is reduced, if not eliminated, by forming the plurality of memory cells layers 302 with the layers 304, which can be removed and replaced with the material 327 (e.g., low k oxide material, silicon oxide, etc.) with or without the air gap 329 contained therein. Moreover, since both the memory cell layers 302 and layers 304 can be etched out using oxygen based etch processes, high aspect ratio memory hole etch and gap fill can be less challenging when compared to conventional processes. Furthermore, when the memory cell layers 302 and the layers 304 are formed from one or more of the aforementioned materials, mechanical stress of the mold stacks can be modulated by the deposition conditions of the aforementioned materials, which, in turn, can reduce, if not eliminate, the likelihood of pattern collapse, and can allow for the overall stack height of the memory device 300/400 to be relatively thin when compared to conventional memory devices. Additionally, the use of conventional replacement metal gate processes, which are sometimes used to build word line staircase, are eliminated, as the memory cell layers 302 are made from one or more of the above described metals (e.g., W).

While the foregoing is directed to embodiments of the present disclosure, other and further embodiments of the disclosure may be devised without departing from the basic scope thereof.

The invention claimed is:

1. A method for forming a plurality of nonvolatile memory cells, comprising:
   forming, on a substrate, a stack of alternating layers of metal including a first layer of metal and a second layer of metal different from the first layer of metal;
   removing the first layer of metal to form spaces between the alternating layers of the second layer of metal;
   one of depositing a first layer of material to partially fill the spaces to leave air gaps therein or depositing a second layer of material to fill the spaces;
   forming at least one memory hole in the stack of alternating layers of the first layer of metal, the second layer of metal, and a layer of silicon nitride (SiN) and poly-silicon (poly-Si) on which the first layer of metal is deposited; and depositing in the at least one memory hole:
- a layer of aluminum oxide (AlO);
- a first layer of silicon oxide atop the layer of AlO;
- a layer of SiN atop the first layer of silicon oxide;
- a second layer of silicon oxide atop the layer of SiN;
- a layer of poly-Si atop the second layer of silicon oxide to form a poly-Si channel; and
- a core silicon oxide to fill the poly-Si channel.

2. The method of claim 1, wherein the one of depositing the first layer of material to partially fill the spaces to leave air gaps therein or depositing the second layer of material in the spaces is performed using one of chemical vapor deposition or atomic layer deposition.

3. The method of claim 1, wherein the first layer of metal and the second layer of metal are deposited using at least one of chemical vapor deposition and physical vapor deposition.

4. The method of claim 1, wherein removing the first layer of metal is performed using one of: a dry chemical etch process containing F chemistries comprising fluorine compounds including at least one of $SF_6$, $CF_4$, $CHF_4$, $CH_3F$, $C_2F_6$, $C_4F_8$, or $NF_3$; or a wet etch process.

5. The method of claim 1, wherein forming the at least one memory hole is performed using a dry chemical etch process containing F chemistries comprising fluorine compounds including at least one of $SF_6$, $CF_4$, $CHF_4$, $CH_3F$, $C_2F_6$, $C_4F_8$, or $NF_3$.

6. The method of claim 1, further comprising, prior to removing the first layer of metal to form spaces between the alternating layers of the second layer of metal:
- forming at least two slits through the first layer of metal, the second layer of metal, and the layer of SiN and poly-Si using F-based chemistry comprising fluorine compounds including at least one of $SF_6$, $CF_4$, $CHF_4$, $CH_3F$, $C_2F_6$, $C_4F_8$, or $NF_3$;
- removing the layer of SiN and poly-Si from the substrate using one of a wet etch process or chemical dry etch process;
- removing, from the at least one memory hole in an area that was occupied by the layer of SiN and poly-Si prior to removal thereof, the layer of AlO, the first layer of silicon oxide atop the layer of AlO, the layer of SiN atop the first layer of silicon oxide, and the second layer of silicon oxide atop the layer of SiN using a chemical dry etch process; and
- depositing a layer of phosphorous doped poly-Si on the substrate in place of the removed layer of AlO, the removed first layer of silicon oxide, the removed layer of SiN, and the removed second layer of silicon oxide to cover a portion of the poly-Si channel.

7. The method of claim 6, further comprising, subsequent to removing the first layer of metal to form spaces between the alternating layers of the second layer of metal and prior to one of depositing the first layer of material to partially fill the spaces to leave air gaps therein or depositing the second layer of material to fill the spaces:
- removing, from the at least one memory hole in an area that was occupied by the layer of first metal prior to removal thereof, the layer of AlO, the first layer of silicon oxide atop the layer of AlO, and the layer of SiN atop the first layer of silicon oxide using the chemical dry etch process.

8. The method of claim 1, wherein the first layer of metal is at least one of tungsten (W), molybdenum (Mo), tantalum (Ta), niobium (Nb), osmium (Os), zirconium (Zr), iridium (Ir), rhenium (Re), titanium (Ti), Ti nitride (TiN), TaN, WN, MoN, ZrN, WOx, RuOx, and IrOx, wherein the second layer of metal is one of W, Mo, Ta, Ru, Nb, Os, Zr, Ir, Re, and Ti, wherein the first layer of material is silicon oxide, and wherein the second layer of material is a low k oxide.

9. The method of claim 8, wherein the low k oxide is one of silicon oxide or silicon dioxide having a dielectric constant that is less than or equal to 3.9.

* * * * *